United States Patent [19]
Ito et al.

[11] Patent Number: 5,635,832
[45] Date of Patent: Jun. 3, 1997

[54] IC CARRIER FOR USE WITH AN IC HANDLER

[75] Inventors: Akihiko Ito, Hanyu; Yoshihito Kobayashi, Gyoda, both of Japan

[73] Assignee: Advantest Corporation, Japan

[21] Appl. No.: 596,279

[22] PCT Filed: Jun. 14, 1995

[86] PCT No.: PCT/JP95/01187

§ 371 Date: Feb. 8, 1996

§ 102(e) Date: Feb. 8, 1996

[87] PCT Pub. No.: WO95/34825

PCT Pub. Date: Dec. 21, 1995

[30] Foreign Application Priority Data

Jun. 15, 1994 [JP] Japan ................... 6-156700

[51] Int. Cl.$^6$ ................ G01R 31/28; G01R 1/04
[52] U.S. Cl. ........................................ 324/158.1
[58] Field of Search ................ 349/71; 324/755; 321/158.1

[56] References Cited

U.S. PATENT DOCUMENTS 5,208,529  5/1993  Tsurishima et al. ............. 324/72.5

FOREIGN PATENT DOCUMENTS

| 64-70384 | 3/1989 | Japan . |
| 2-122645 | 5/1990 | Japan . |
| 7-14647 | 3/1995 | Japan . |

*Primary Examiner*—Kenneth A. Wieder
*Assistant Examiner*—Barry C. Bowser
*Attorney, Agent, or Firm*—Staas & Halsey

[57] ABSTRACT

An IC carrier for loading thereon and transporting a device under test is used in an IC handler. The IC carrier is capable of easily and reliably loading thereon and positioning in place a device under test even the device under test having a reduced pitch between lead pins thereof. A box-like housing open in the top is formed and the bottom wall thereof has two generally parallel contact holes in the form of elongated slots, these two contact holes being spaced from each other by a spacing corresponding to that between two arrays of lead pins of the device under test. Each of the contact holes has a length corresponding to that of the associated lead pin array and a width sufficient to receive the associated lead pin array. Carrier guides are formed one adjacent each of opposite longitudinal ends of each of the contact holes and extend upwardly to a predetermined height from the bottom floor of the housing. The distance between the side walls of the carrier guides opposing each other transversely of the length of the contact holes is selected such that the device under test is accommodated between the opposed side walls of the carrier guides. The socket for applying electric signals to the device under test has two rows of socket terminals spaced apart by substantially the same distance as the spacing between the two contact holes, each row containing socket terminals of the same number and same pitch as the pins of the corresponding lead pin array of the device under test. Insulating thin plate members are interposed between adjacent socket terminals of each of said socket terminal rows. The socket terminals are adapted to be inserted into the contact holes and be electrically connected with the lead pins of the device under test during the electric testing.

5 Claims, 7 Drawing Sheets

Fig. 11

IC CARRIER FOR USE WITH AN IC HANDLER

TECHNICAL FIELD

This invention relates to an IC handler for use in a semiconductor device testing apparatus (IC tester), and more particularly, to IC carriers for transporting devices under test (each is generally referred to as DUT) in an IC handler.

BACKGROUND ART

An IC tester for testing semiconductor devices (generally, ICs, i.e., semiconductor integrated circuits) usually employs an IC handler integrally incorporated therein for transporting IC carriers loaded with ICs under test or trays carrying thereon IC carriers loaded with ICs under test from a loader section to a testing zone, and upon the test being completed, transporting them from the testing zone to an unloader section where the tested ICs are sorted into corresponding categories based on the data of the test results.

Figure 1:
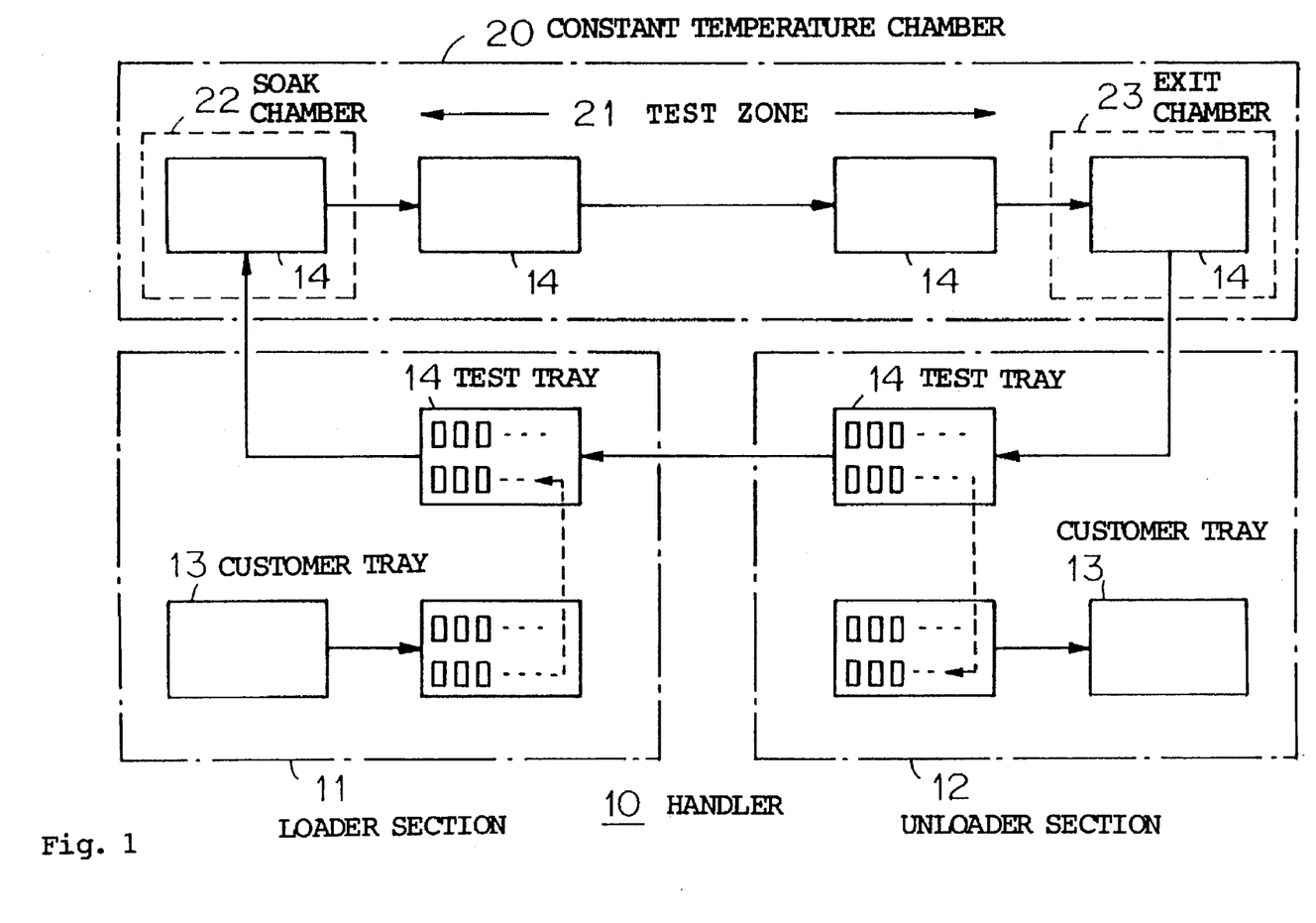
FIG. 1 is a diagrammatical illustration showing the whole construction of a prior art IC handler of the forced horizontal transporting system in the form of a flow chart.

An example of the prior art IC handler called "forced horizontal transporting system" is shown in the form of a flow chart in FIG. 1. The IC handler 10 comprises a loader section 11 where ICs 15 under test carried on a customer (user) tray 13 are transferred and reloaded onto a test tray 14 capable of withstanding high/low temperatures, an unloader section 12 where tested ICs 15 are sorted, transferred and reloaded on customer trays 13 from a test tray 14, and a constant temperature chamber 20 including a testing zone 21 for receiving and testing the ICs from the loader section 11. The test trays 14 are moved in a circulating manner from and back to the loader section 11 sequentially through the constant temperature chamber 20 and the unloader section 12. More specifically, the test tray 14 loaded with ICs 15 to be tested is transported from the loader section 11 to a soak chamber 22 within the constant temperature chamber 20 where the ICs 15 on the test tray 14 are heated or cooled to a predetermined constant temperature. Generally, the soak chamber 22 is adapted to store a plurality of (say, ten) test trays 14 stacked one on another such that a test tray 14 newly received from the loader section 11 is stored at the bottom of the stack while the uppermost test tray is carried to the testing zone 21. The ICs 15 to be tested are heated or cooled to a predetermined constant temperature while the test tray 14 is moved from the bottom to the top of the stack within the soak chamber 22, and the heated or cooled ICs 15 together with the test tray 14 having the heated or cooled ICs 15 loaded are then transported while maintained at the constant temperature from the soak chamber 22 to the testing zone 21 where each of the ICs under test is brought into electrical contact with an IC socket (not shown) disposed in the testing zone 21 and electric characteristics of the ICs are measured. Upon completion of the test, the ICs 15 together with the test tray 14 are transported from the testing zone 21 to an exit chamber 23 where they are restored to the ambient temperature. Like the soak chamber 22, the exit chamber 23 is also adapted to store test trays in the form of a stack. In one embodiment the ICs 15 under test may be brought back to the ambient temperature as the associated test tray is moved sequentially from the top to the bottom of the stack within the exit chamber 23. Thereafter, the ICs 15 under test as carried on the test tray 14 are passed to the unloader section 12 where the tested ICs are sorted into categories based on the data of the test results and transferred from the test tray 14 onto the corresponding customer trays 13. The test tray 14 emptied in the unloader section 12 is delivered back to the loader section 11 where it is again loaded with ICs 15 to be tested from the customer tray 13 to repeat the same steps of operation. It is to be noted that the transfer of ICs 15 under test between the customer tray 13 and the test tray 14 is typically effected by suction transport means utilizing a vacuum pump which may pick up one to several ICs at a time for the transfer.

While the IC handler 10 illustrated in FIG. 1 is of the type which is configured to transport ICs under test together with the tray on which the ICs are loaded, IC handlers of the type adapted to transport ICs under test individually are also currently used.

As described above, an IC under test as loaded on the IC carrier is transported by the IC handler 10 from the loader section 11 to the testing zone 21 whence upon completion of the test they are passed to the unloader section 12. It should here be pointed out that surface mounting type ICs received in flat packages each of which has two arrays of leads extending from opposite sides thereof (flat package type ICs) as represented by the SOP (small outline package) and TSOP (thin small outline package) are tested for their electric characteristics in the testing zone by that each of the ICs is electrically connected with an IC socket as it is carried on an IC carrier. There are a variety of flat package type ICs with respect to the inter-lead array spacing (which refers to the spacing between two arrays of lead pins here in this specification), the number of pins, and the inter-pin spacing (which refers here to the spacing between adjacent lead pins in the lead pin array). To handle ICs of such various types of pin arrangement for electric testing, the IC handler has to exchange all IC carriers used for ICs of one specified type for IC carriers dedicated to ICs of another specified type whenever the inter-lead array spacing, the number of pins and/or the inter-pin spacing of the IC to be tested are varied. Moreover, with an increase in the integration density (higher the density of integration) of IC, the number of leads protruding from an IC package is increased with a decrease in the pin spacing (reduction in the pin pitch). To take one example, an IC having the inter-pin spacing of 0.5 mm has so small an inter-lead gap (gap between opposed edges of two adjacent lead pins) as about 0.2 mm (because each of the lead pins has a thickness or width of about 0.3 mm).

Figure 2:
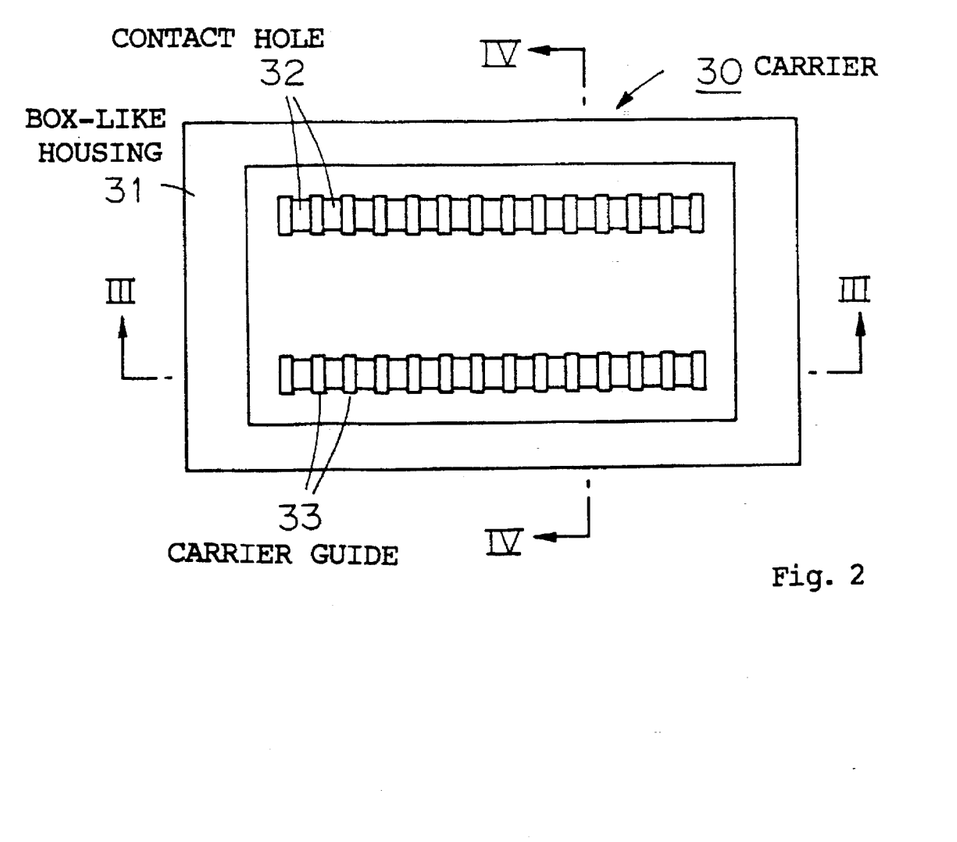
FIG. 2 is a plan view showing an example of the prior art IC carrier used in the prior art IC handler.
Figure 3:
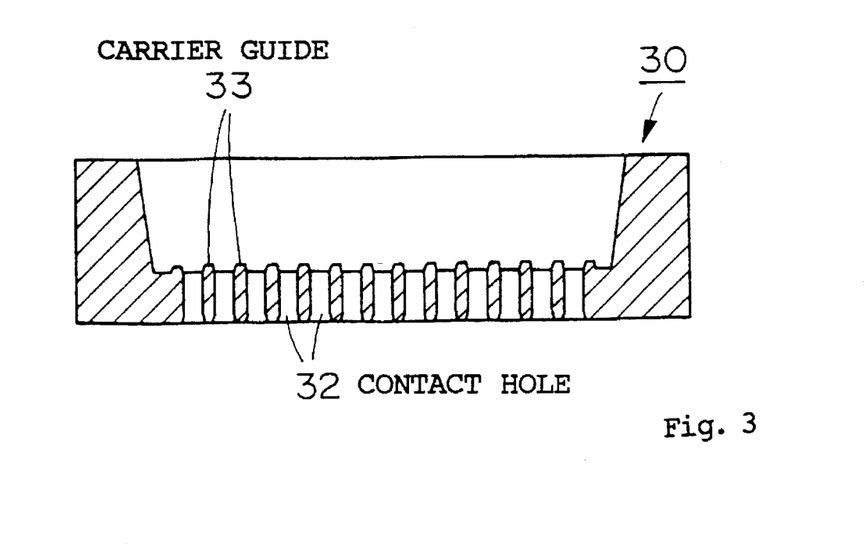
FIG. 3 is a generally cross-sectional view of the IC carrier of FIG. 2 taken along the line III—III.
Figure 4:
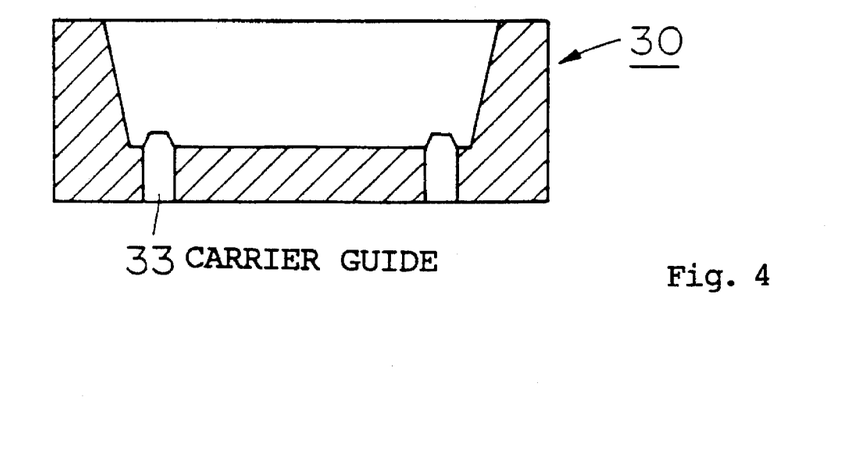
FIG. 4 is a generally cross-sectional view of the IC carrier of FIG. 2 taken along the line IV—IV.

A typical example of the conventional IC carrier is illustrated in FIGS. 2–4. As shown in FIG. 2, the IC carrier 30 comprises a box-like housing 31 which has a generally rectangular shape in plan and is open in the top thereof. A flat package type IC is accommodated within the box-like housing 31. Formed in the bottom wall of the box-like housing 31 are two rows of contact holes 32 corresponding to the inter-lead array spacing, the inter-pin spacing and the number of pins of the flat package type IC to be housed. The contact holes 32 of each row are defined by thin plate carrier guides 33 two more than the number of leads of the flat package type IC to be accommodated, the carrier guides being spaced apart at predetermined intervals. As seen in FIGS. 3 and 4, these carrier guides 33 are positioned to project upwardly by a predetermined distance above the plane of the bottom floor of the housing 31, and the transverse dimension (width) of the flat package type IC (the distance between the two opposed sides of IC from which the leads protrude) is accommodated between the opposed side walls defined by the two rows of carrier guides 33 whereby the transverse (width-wise) movement of the flat package type IC is constrained, that is, the transverse position of the flat package type IC is determined in the housing. Alternatively, separate carrier guides having a positioning function which serves to transversely locate a flat package type IC to be received may be provided, and both the carrier guides 33 and the separate carrier guide may be used. The longitudinal dimension (length) of the bottom floor of the housing 31 is sized so as to correspond to the longitudinal dimension of the flat package type IC (the distance between the two opposed sides of IC from which no leads protrude) to thereby determine the longitudinal position of the flat package type IC in the housing. It is to be noted that the side walls of the housing 31 are tapered as illustrated to facilitate the insertion of the flat package type IC.

All of the rectangular housings 31 in all types of IC carrier have their exterior structures of the same shape and same size so that they can utilize the transport mechanism in the IC handler in common whereas the interior structures thereof vary from one to another IC carrier so as to accommodate various flat package type ICs differing in the exterior configuration and the number of pins. It is for this reason that whenever the inter-lead array spacing, the number of pins and/or the inter-pin spacing of the flat package type IC to be tested are changed, the IC handler exchanges one type of IC carrier for another having a corresponding proper construction. A great number of, say 50 to 200 such IC carriers 30 are used in an IC handler.

Figure 5:
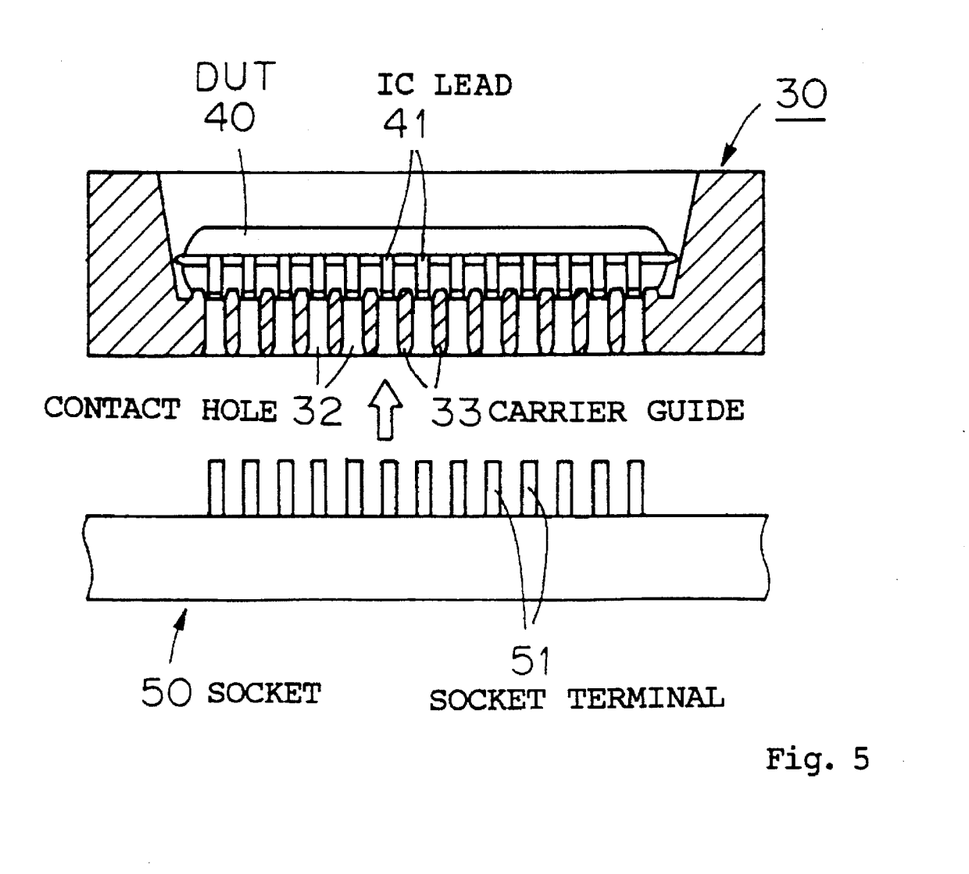
FIG. 5 is an outline view showing the IC carrier of FIG. 2 in a cross-section to illustrate how an IC under test loaded on the IC carrier is tested.

The contact holes 32 are provided to permit the electrical testing to be effected on the IC under test while it is loaded on the IC carrier 30 in the testing zone 21. As illustrated in FIG. 5, when an IC (flat package type IC) 40 under test is deposited on the IC carrier 30, the IC leads 41 thereof are guided by the carrier guides 33 to overlie the corresponding contact holes 32. It is thus to be understood that the carrier guides 33 not only act as positioning guides to guide the IC leads 41 of the IC 40 under test into the respective contact holes 32, but also serve to prevent any lateral displacement of the IC leads 41 and short-circuit between adjacent IC leads as the upper end portions of the carrier guides 33 are interposed into respective gaps between adjacent IC leads 41.

Figure 6:
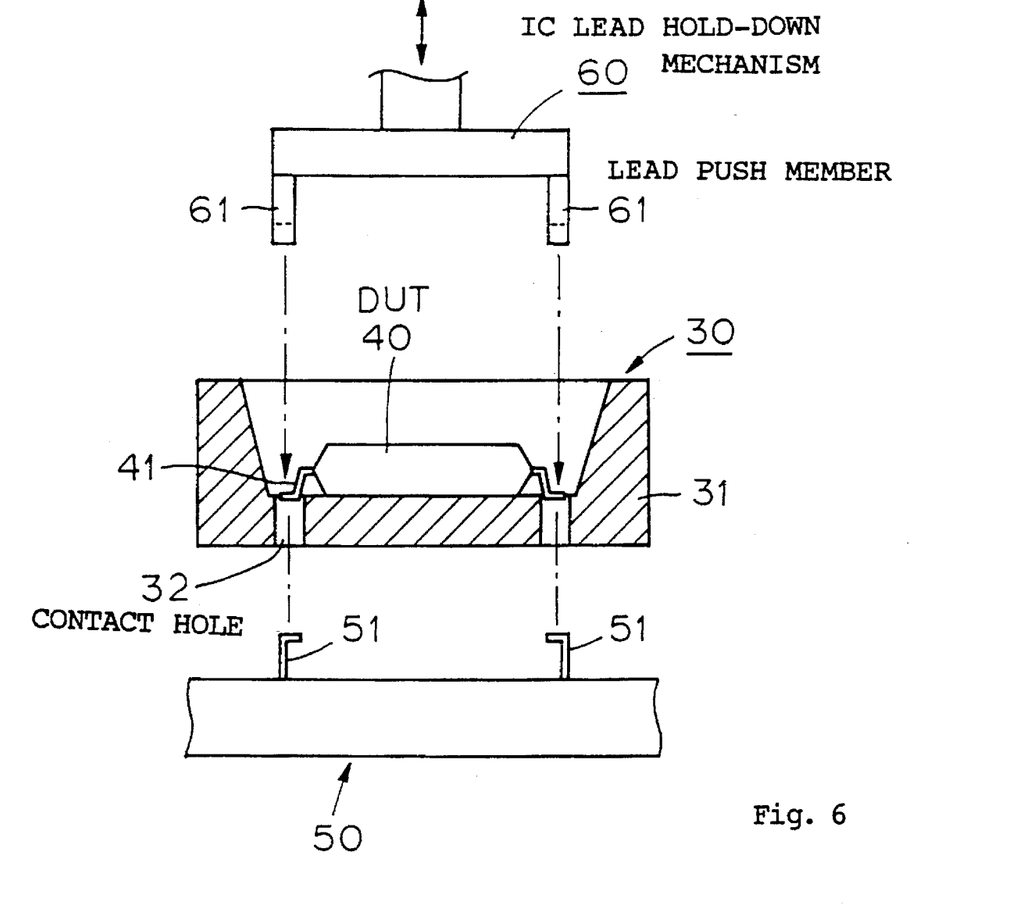
FIG. 6 is an outline view as seen from the right hand side of FIG. 5.

The IC socket 50 for use in the electric testing in the testing zone 21 is provided with two rows of socket terminals (contacts) 51 spaced apart by the same distance as the spacing between the two rows of carrier guides 33, the socket terminals 51 of each row being of the same number and same pitch as the carrier guides 33 of the corresponding row. When the electric testing is to be carried out, the socket terminals 51 are inserted into the respective contact holes 32 of the IC carrier 30. During the test an IC lead hold-down mechanism 60 presses on the leads 41 of the IC 40 under test, as illustrated in FIG. 6, in order to insure electric contact between the leads 41 and the respective socket terminals 51 inserted into the contact holes 32. The IC lead hold-down mechanism 60 comprises a pair of insulative comb-like push members 61 having fingers equal in number and pitch to the leads 41 of the IC 40 under test, the arrangement being such that the fingers of each of the push members 61 will push down on the horizontally out-turned outer end portions of the corresponding leads 41 of the IC 40 under test to insure the electric contact with the socket terminals 51 in the contact holes 32.

As indicated above, with a recent enhancement in the integration density of IC, the more and more leads does the IC package have protruding therefrom with a corresponding decrease in the pin spacing. There have been evolved numerous ICs having an inter-lead gap (gap between opposed edges of two adjacent lead pins of each lead pin array of an IC) narrower than 0.2 mm. It follows that the thickness of the carrier guides 33 constituting partition walls for separating the contact holes 32 of the IC carrier 30 from each other must also be reduced to less than 0.2 mm, but it would be very difficult to fabricate such thin carrier guides. In addition, since the material of which the carrier guides 33 are made (normally molded integrally with the IC carrier 33) is an insulating material such as a plastic resin or the like, thin carrier guides are so weak in their strength, bringing forth the drawbacks that they may be broken when the IC under test is loaded on the IC carrier 30, that during the loading the IC leads 41 are apt to hit the carrier guides 33 to be bent thereby due to the reduced pitch between the pins, and that it takes a longer time to load the IC carrier with an IC.

DISCLOSURE OF THE INVENTION

It is an object of this invention to provide an IC carrier which is capable of positioning an IC to be tested in a stable and positive manner even if the IC has a narrow inter-pin spacing.

Another object of this invention is to provide an IC carrier which is easy to manufacture and inexpensive.

According to the present invention, an IC carrier for use in an IC handler is provided which comprises: a box-like housing open in the top for accommodating a device under test therein; two generally parallel contact holes in the form of elongated slots formed in the bottom wall of the box-like housing, the two contact holes being spaced from each other by a spacing corresponding to that between the two arrays of lead pins of a device under test to be accommodated, each of the contact holes having a length corresponding to that of the corresponding lead pin array and a width sufficient to receive the corresponding lead pin array; and carrier guides one formed adjacent each of opposite longitudinal ends of each of the contact holes and extending upwardly to a predetermined height from the bottom floor of the housing, the distance between the side walls of the carrier guides opposing each other transversely of the length of the contact holes being selected such that the device under test is accommodated between the opposed side walls of the carrier guides.

With the construction of this invention as described above, the provision of the contact holes in the form of elongated slots having a simple shape makes it easy to manufacture the IC carrier, and yet permits the lead pins of the device under test to be readily inserted into the contact holes. In addition, it is to be appreciated that the same IC carrier may be used on another type of IC package having a finer pitch between lead pins protruding therefrom as long as the length of the pin array is the same, eliminating the need for exchanging the IC carrier for another, and hence enhancing the operating efficiency. Moreover, since carrier guides are disposed at four locations one at each of the opposite longitudinal ends of each contact hole to position the device under test, it is possible to form relatively large guides, independently of the pitch between the lead pins. This may provide the carrier guides with a substantial strength so that there is no likelihood of the guides being damaged even if they are formed with a taper. It is thus easy to provide the carrier guides with a taper. What is more, upon being loaded on the IC carrier, the device under test is restrained with respect to its position in the lead pin array direction by the pins at the opposite extreme ends of each lead pin array engaging with the carrier guides and with respect to the transverse position in a direction perpendicular to the direction of lead pin array by the side walls of the IC package along the perpendicular direction engaging with the corresponding sides of the carrier guides, whereby once loaded on the IC carrier, the device under test is held in position in a stable manner to insure good electric contact between the leads and the respective socket terminals for the electric testing, resulting in enhanced reliability.

BEST MODES FOR CARRYING OUT THE INVENTION

One embodiment of the present invention will be described in details with reference to the accompanying drawings.

Figure 7:
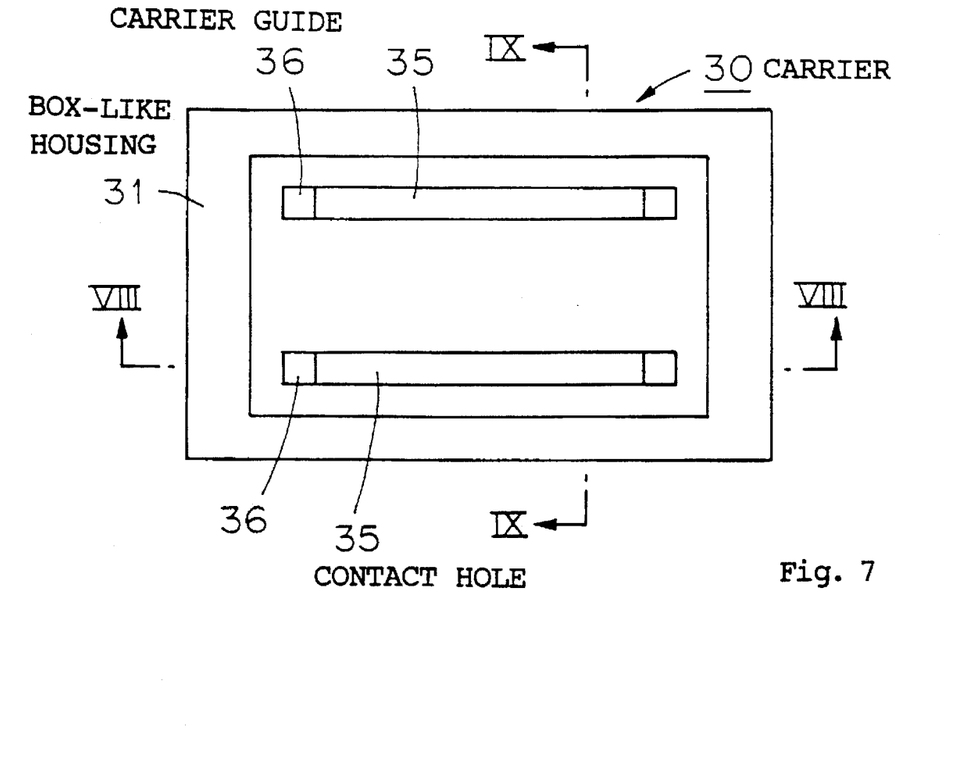
FIG. 7 is a plan view showing an embodiment of the IC carrier according to this invention.
Figure 8:
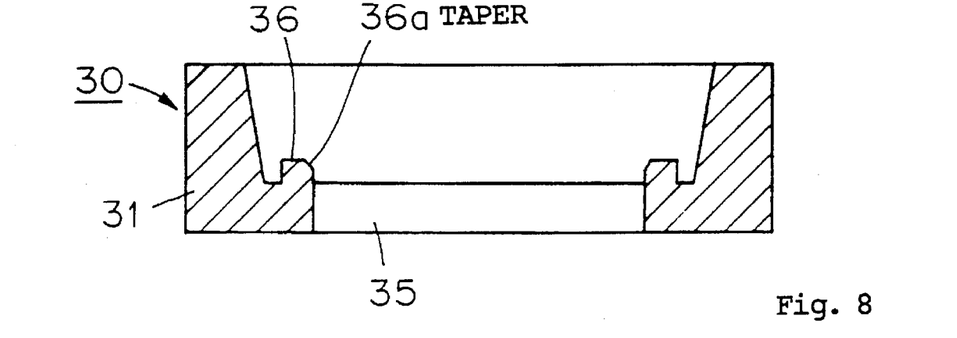
FIG. 8 is a generally cross-sectional view of the IC carrier of FIG. 7 taken along the line VIII—VIII.
Figure 9:
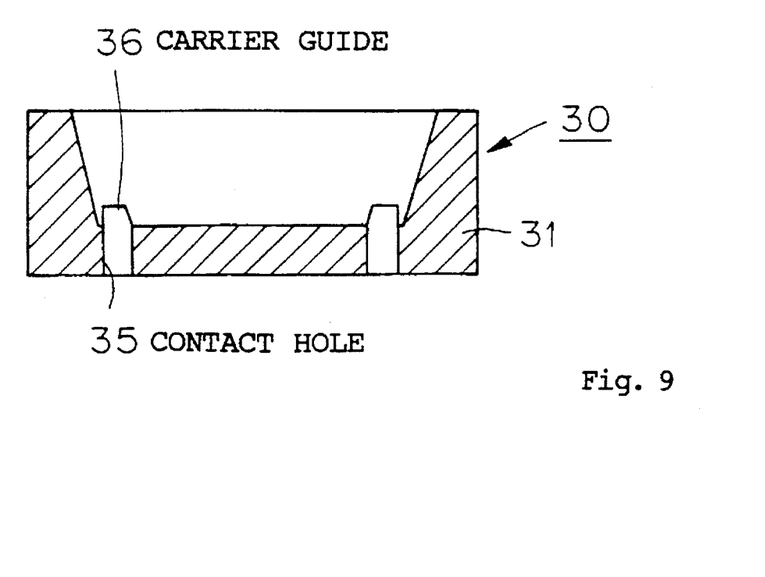
FIG. 9 is a generally cross-sectional view of the IC carrier of FIG. 7 taken along the line IX—IX.

FIGS. 7–9 illustrate the construction of an embodiment of the IC carrier according to this invention. As shown in FIG. 7, the IC carrier 30 comprises a box-like housing 31 which has a generally rectangular shape in plane and is open in the top thereof. A flat package type IC is accommodated within the box-like housing 31. Formed in the bottom wall of the housing 31 are two generally parallel contact holes 35 in the form of elongated slots formed in the bottom wall of the housing longitudinally of the housing, the two contact holes being spaced from each other by a spacing corresponding to the inter-lead array spacing of the flat package type IC. Carrier guides 36 in the shape of a square post are formed one adjacent each of the opposite longitudinal ends of each contact hole 35.

As shown in FIGS. 8 and 9, these four carrier guides 36 are positioned substantially symmetrically about a longitudinal straight line passing through the center of the bottom wall of the housing 31 (substantially symmetrically about a transverse (width-wise) straight line passing through the center as well in the illustrated embodiment) and project upwardly by a predetermined distance above the bottom floor of the housing 31.

Figure 10:
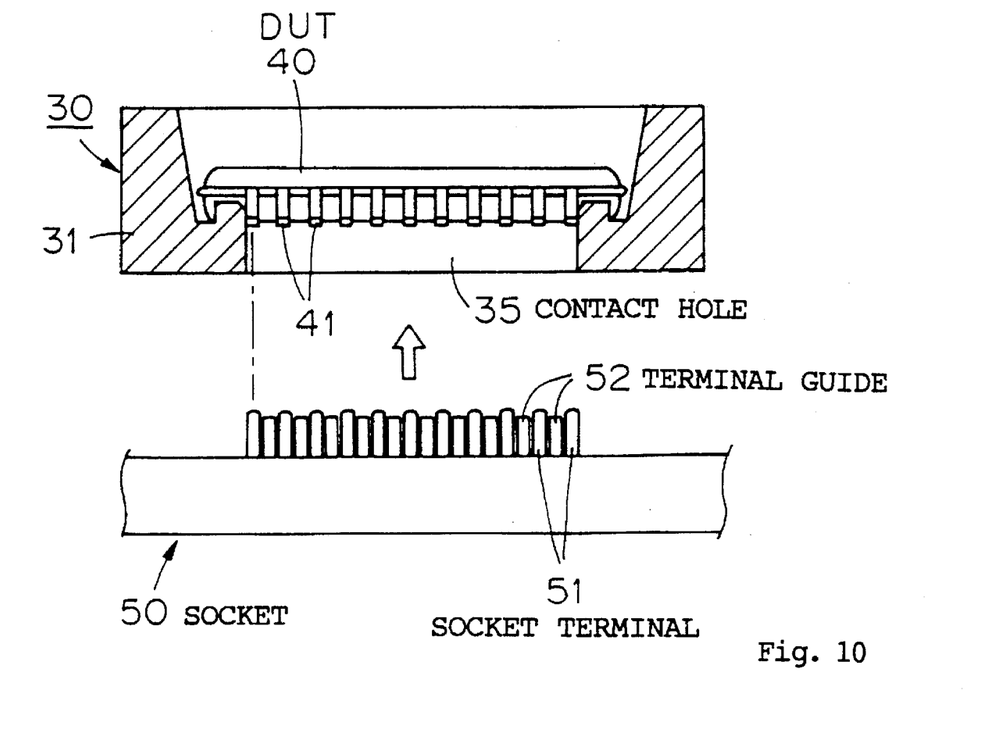
FIG. 10 is an outline view showing the IC carrier of FIG. 7 in a cross-section to illustrate how an IC under test loaded on the IC carrier is tested.
Figure 11:
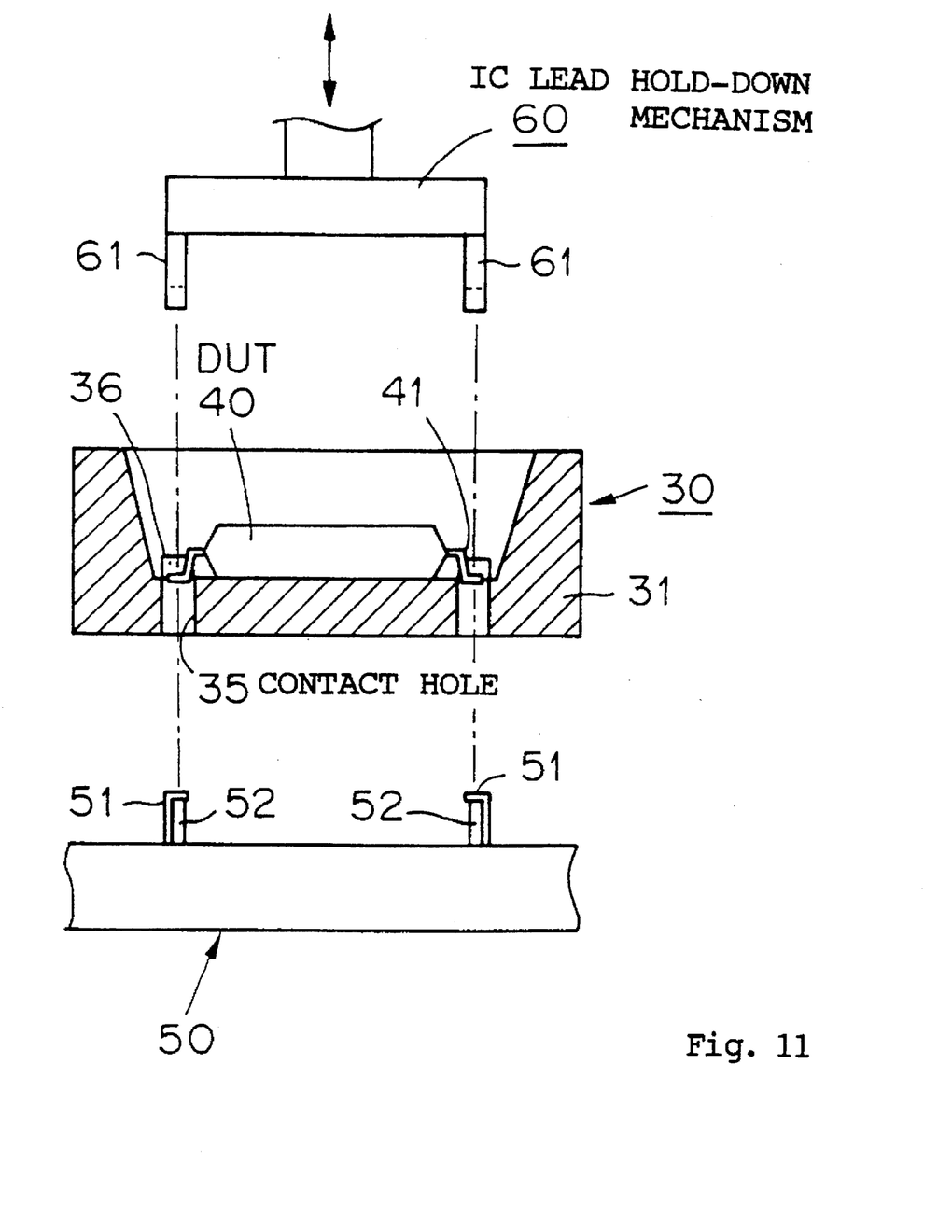
FIG. 11 is an outline view as seen from the right hand side of FIG. 10.

The longitudinal and transverse spacings between the longitudinally and transversely opposed carrier guides 36, respectively are selected such that as is best seen in FIG. 11, the width dimension of the flat package type IC 40 is accommodated between the opposed side walls of the guides 36 in the width-wise direction of the IC carrier 30 (transversely of the contact holes) and that as is best seen in FIG. 10, each of the arrays of IC lead pins 41 of the flat package type IC 40 is accommodated between the opposed side walls of the guides 36 in the longitudinal direction of the IC carrier 30 (with the outer side surfaces of the pins at the opposite extreme ends of each lead pin array being substantially in contact with the associated sides of the guides 36). It is thus to be understood that both the transverse and longitudinal movements of the flat package type IC 40 are constrained by these four carrier guides 36, that is, the transverse and longitudinal positions of the flat package type IC 40 are determined by the four carrier guides 36. It is noted that the four carrier guides 36 have their longitudinally opposed side walls formed with a taper 36a extending downwardly and inwardly from the top thereof as illustrated so that the pins at the opposite extreme ends of each lead pin array of the flat package type IC 40 may not interfere with the corresponding tops of the carrier guides 36. Similarly, the width-wise opposed side walls of the four carrier guides 36 are formed with a taper extending downwardly and inwardly from the top toward bottom thereof as illustrated so as to facilitate the loading of the IC to be tested onto the IC carrier.

Due to the provision of the contact holes 35 in the form of elongated slots, the IC carrier 30 according to this invention permits easy insertion of the IC leads into the contact holes without the possibility that the IC leads may hit the carrier guides to get bent or that an unexpectedly longer time may be required for the insertion as may be the case with the prior art. In addition, the same IC carrier may be used on another type of IC package having lead pin arrays protruded therefrom the inter-pin spacing of which is reduced as long as the length of the lead pin array is the same, eliminating the need for exchanging the IC carrier for another, and hence enhancing the operating efficiency. Furthermore, as the IC leads are inserted into the contact holes 35, the tapered side surfaces 36a of the carrier guides 36 which engage with the pins at the opposite extreme ends of the lead pin arrays serve to guide the IC leads stably and smoothly into the contact holes 35. Consequently, there is little possibility of the IC leads of being deformed or hitting the carrier guides during the loading. Additionally, when the IC is loaded on the IC carrier, the longitudinal position of the IC (in the direction of the lead pin array) is determined by the pins at the opposite extreme ends of the lead pin arrays engaging with the carrier guides 36 while at the same time the transverse position of the IC in a direction perpendicular to the direction of the lead pin array is determined by the side walls of the IC package along the perpendicular direction engaging with the corresponding sides of the carrier guides 36. The loaded IC is thus held in position in a stable manner to insure good electric contact between the leads and the respective socket terminals for the electric testing, resulting in enhanced reliability.

On top of that, since the carrier guides 36 are disposed at four locations one at each of the opposite longitudinal ends of each contact hole to position the IC, it is possible to form guides of a relatively large size (thickness and width), thoroughly independently of the pitch between the pins of the IC leads. This permits easy fabrication of the carrier guides, leading to reduction of cost. Furthermore, it is possible to provide the carrier guides with a substantial strength so that there is no fear of the guides being damaged even if they are formed with a taper. It is also easy to provide the carrier guides with a taper 36a. In addition, since the contact holes 36 are simple elongated slots and no high accurate processing or working is required, it is easy to fabricate the IC carrier thereby contributing to reducing the cost thereof as a whole.

The IC 40 under test (flat package type IC) loaded on the IC carrier 30 having the structure as described above is transported by the IC handler to the testing zone where the electric test is carried out. The socket 50 for applying electric signals to the IC 40 under test carried on the IC carrier 30 has two rows of socket terminals (contacts) 51 spaced apart from each other by substantially the same spacing between the contact holes 36, each row containing the socket terminals of the same number and same pitch as the pins of the corresponding lead pin array of the IC 40 under test so that, when tested, the two rows of socket terminals 51 are inserted into the corresponding contact holes 36 of the IC carrier 30. In order to insure that electric contact is maintained between the leads 41 of the IC 40 under test and the corresponding socket terminals 51 of the socket 50 inserted into the contact holes 36 during the test, the IC lead hold-down mechanism 60 presses down on the horizontally bent tip ends of the leads 41 of the IC 40 under test as described hereinbefore with reference to the prior art.

There is a possibility that some of the socket terminals 51 of the socket 50 pressed by the leads may get crooked under the pressure from the IC lead hold-down mechanism 60 to cause a short-circuit between adjacent socket terminals. For this reason, according to this invention, insulating terminal guides 52 in the form of a thin plate are interposed between adjacent socket terminals 51 to prevent any short-circuit from being formed between the adjacent socket terminals. The terminal guides 52 may be of the same shape and size and are more or less shorter in height than the socket terminals 51 so as not to interfere with electric contact between the leads 41 of the IC 40 and the socket terminals 51. The terminal guides 52 may be termed insulating members (means) interposing between adjacent socket terminals rather than guides in that they act not only to hold the socket terminals in their upright position to permit good electric contact with the IC leads, but also to prevent any short-circuit from being caused between adjacent socket terminals. No substantial mechanical strength is required of the terminal guides 52 since they are neither in the least interfered by the IC carrier 30 nor contacted by the IC leads 41 when electric contact is established between the socket terminals 51 and the IC leads 41. Consequently, the terminal guides 52 may be extremely reduced in thickness as required, so that it is possible to readily accommodate any reduced pitch between the IC leads. Evidently, there is no manufacturing problem. While the use of insulating thin plate terminal guides 52 between adjoining socket terminals 51 may cause a slight increase in the cost of manufacture, the number of sockets is much smaller than that of IC carriers, and hence any reduction in the cost of the IC carrier advantageously leads to a substantial decrease in the cost of the entire IC handler.

We claim:

1. An IC handler arranged such that an IC under test having two opposed arrays of lead pins projecting therefrom is transported as loaded on an IC carrier to a testing zone where electric signals are applied through a socket to the IC under test loaded on the IC carrier for performing an electric testing, said IC carrier comprising:

a box-like housing (30) open in the top for accommodating a device under test therein;

two generally parallel contact holes (35) in the form of elongated slots formed in the bottom wall of said box-like housing, said two contact holes being spaced from each other by a spacing corresponding to that between the two lead pin arrays of said device under test to be accommodated, each of the contact holes having a length corresponding to the corresponding lead pin array and a width sufficient to receive the corresponding lead pin array; and carrier guides (36) one formed adjacent each of opposite longitudinal ends of each of said contact holes and extending upwardly to a predetermined height from the bottom floor of said housing, the distance between the side walls of said carrier guides opposing each other transversely of the length of the contact holes being selected such that the device under test is accommodated between said opposed side walls of the carrier guides.

2. The IC handler according to claim 1 wherein said socket for applying electric signals to the IC under test has two rows of socket terminals (51) spaced apart by substantially the same distance as the spacing between said two contact holes, each row containing socket terminals of the same number and same pitch as the pins of the corresponding lead pin array of the IC under test, insulating thin plate members (52) being interposed between adjacent pins of each of said lead pin arrays, and said two rows of socket terminals being adapted to be inserted into the corresponding contact holes during the electric testing.

3. The IC handler according to claim 2 wherein said insulating thin plate members are shorter in height than said socket terminals.

4. The IC handler according to claim 1 wherein said carrier guides have each of their longitudinally opposed side walls formed with a taper (36a) extending downwardly from the top thereof.

5. The IC handler according to claim 1 wherein said carrier guides are positioned substantially symmetrically about a straight line passing through the center of the bottom wall of said housing and substantially parallel to said contact holes.

* * * * *